(12) United States Patent
Tang et al.

(10) Patent No.: US 7,102,371 B1
(45) Date of Patent: Sep. 5, 2006

(54) BILEVEL PROBE

(75) Inventors: Tze Kang Tang, Melaka (MY); Sek Hoi Chong, Melaka (MY); Chin Chai Gan, Melaka (MY); Fuen Siang Ng, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 223 days.

(21) Appl. No.: 10/850,229

(22) Filed: May 19, 2004

(51) Int. Cl.
*G01R 31/02* (2006.01)
*G01R 31/26* (2006.01)

(52) U.S. Cl. ..................................... 324/754; 324/765
(58) Field of Classification Search ..................... None
See application file for complete search history.

(56) References Cited

U.S. PATENT DOCUMENTS

| | | | | |
|---|---|---|---|---|
| 3,905,098 A | | 9/1975 | Garretson et al. ............. 29/628 |
| 4,242,152 A | * | 12/1980 | Stone ..................... 219/121.61 |
| 4,599,559 A | | 7/1986 | Evans .................... 324/158 P |
| 5,554,940 A | * | 9/1996 | Hubacher .................. 324/765 |
| 5,597,737 A | * | 1/1997 | Greer et al. .................. 438/17 |
| 5,629,630 A | | 5/1997 | Thompson et al. ......... 324/754 |
| 5,893,988 A | * | 4/1999 | Tomioka ................ 219/121.68 |
| 6,162,652 A | * | 12/2000 | Dass et al. .................... 438/18 |
| 6,181,145 B1 | * | 1/2001 | Tomita et al. .............. 324/754 |
| 6,229,097 B1 | * | 5/2001 | Suppelsa et al. ............ 174/260 |
| 6,281,111 B1 | * | 8/2001 | Ohsumi ....................... 438/623 |
| 6,327,158 B1 | * | 12/2001 | Kelkar et al. ................ 361/779 |
| 6,369,407 B1 | * | 4/2002 | Hikita et al. .................. 257/48 |
| 6,456,099 B1 | * | 9/2002 | Eldridge et al. ............. 324/754 |
| 6,534,853 B1 | * | 3/2003 | Liu et al. ..................... 257/692 |
| 6,552,555 B1 | * | 4/2003 | Nuytkens et al. ........... 324/754 |
| 6,603,324 B1 | * | 8/2003 | Eldridge et al. ............. 324/755 |
| 6,611,458 B1 | * | 8/2003 | Ishibashi et al. ....... 365/185.09 |
| 6,686,615 B1 | * | 2/2004 | Cheng et al. ................ 257/208 |
| 6,759,318 B1 | * | 7/2004 | Chang ......................... 438/612 |
| 6,798,232 B1 | * | 9/2004 | Lim ............................ 324/770 |
| 6,825,052 B1 | * | 11/2004 | Eldridge et al. .............. 438/15 |
| 6,869,809 B1 | * | 3/2005 | Yu et al. ....................... 438/14 |
| 6,933,524 B1 | * | 8/2005 | Hembree et al. .............. 257/48 |
| 6,940,093 B1 | * | 9/2005 | Eldridge et al. ............... 257/48 |
| 2001/0052786 A1 | * | 12/2001 | Eldridge et al. ............. 324/765 |
| 2004/0161865 A1 | * | 8/2004 | Yu et al. ....................... 438/14 |
| 2005/0007129 A1 | * | 1/2005 | Pu .............................. 324/754 |
| 2005/0248011 A1 | * | 11/2005 | Jung et al. .................. 257/678 |

OTHER PUBLICATIONS

Kulicke & Soffa Industries, Inc., "Standard Epoxy Cantilever Probe Cards" and "Ceramic Ring Cantilever Probe Cards", www.kns.com, 2001, 2 pages.

* cited by examiner

*Primary Examiner*—Paresh Patel
(74) *Attorney, Agent, or Firm*—Beyer Weaver & Thomas, LLP

(57) ABSTRACT

An apparatus for electrical testing of semiconductor devices is provided. A printed circuit board is provided. A first plurality of probe pins for probing bump connectors is electrically and mechanically connected to the printed circuit board. A second plurality of probe pins for probing probe pads is electrically and mechanically connected to the printed circuit board.

17 Claims, 7 Drawing Sheets

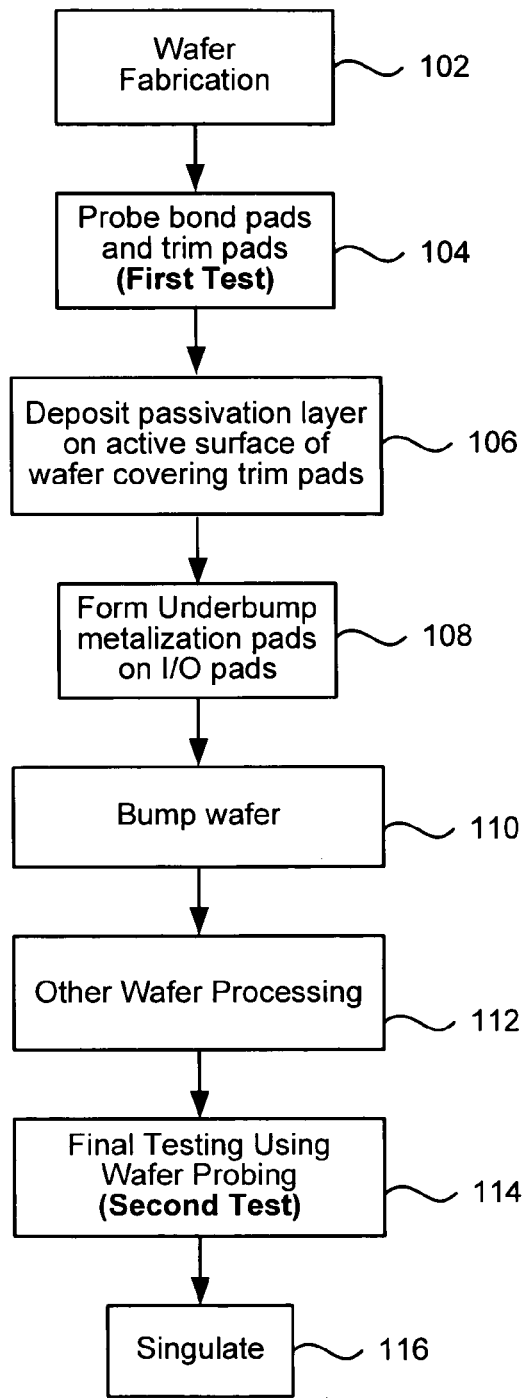
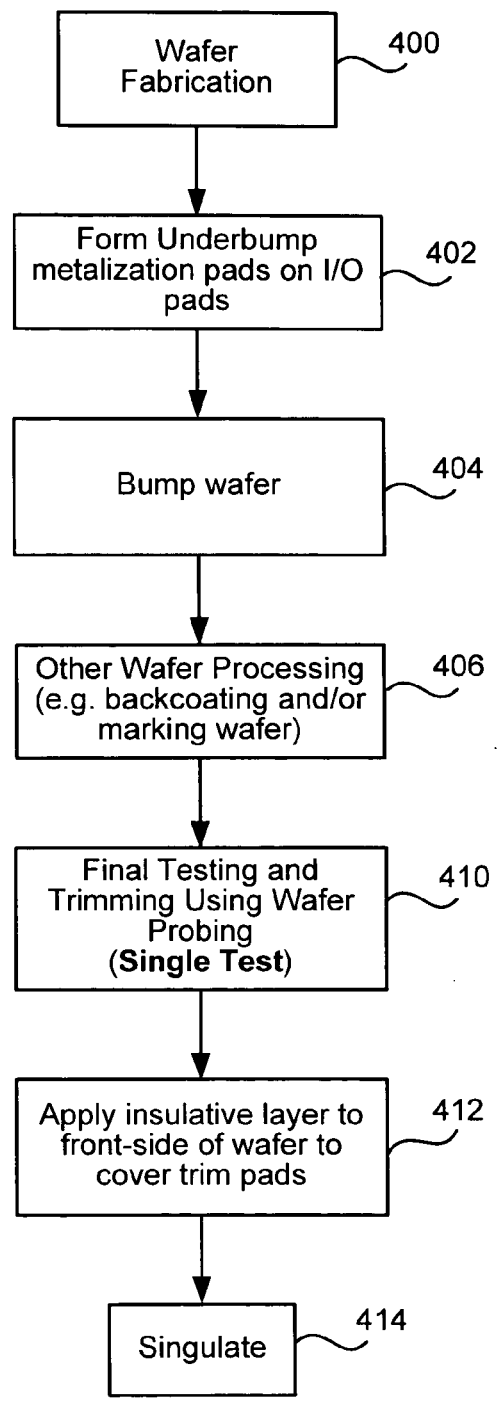

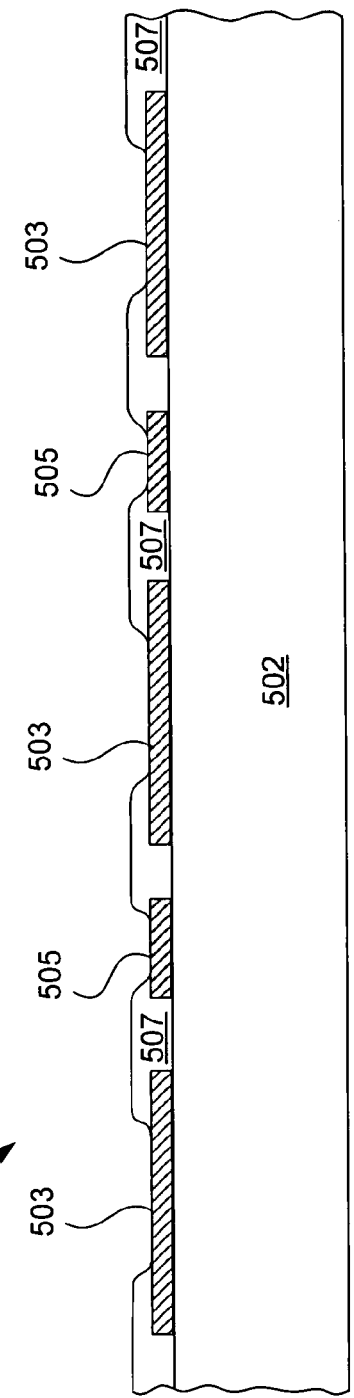
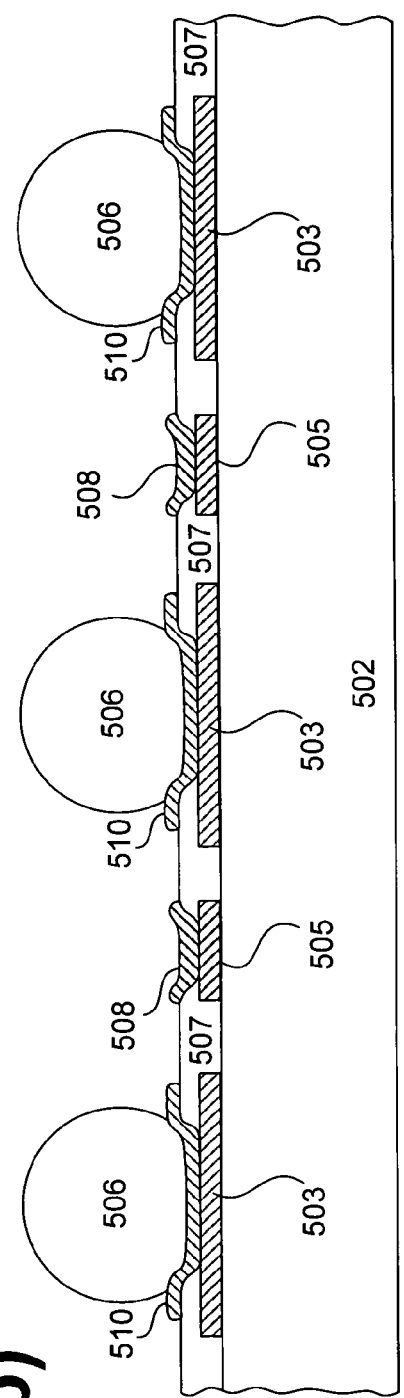
Fig. 5(a)
Fig. 5(b)

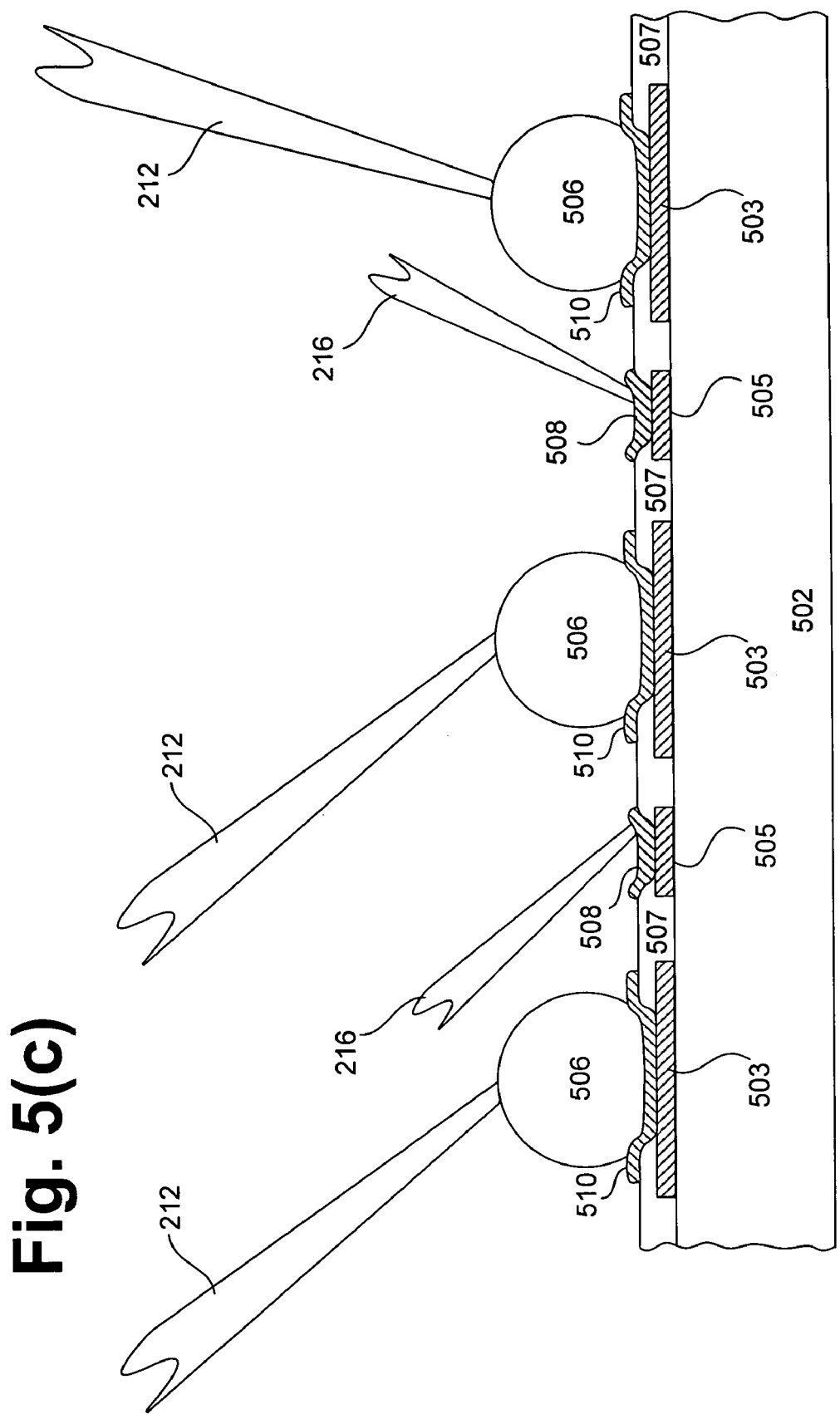

BILEVEL PROBE

BACKGROUND

The present invention relates generally wafer level processing of integrated circuits. More particularly, a wafer level packaging arrangement is described that permits electrical testing and/or processing of both bump connectors and probe pads to be accomplished during a single probing sequence.

Electrical testing may be performed to identify non-operational chips on the wafer before the chips are diced and packaged. The electrical testing may be done through probe pins on the probe cards that contact the probe pads.

Probe pad types may be pads that are for customer use and pads that are solely for manufacturer use. The probe pads that are needed for customer applications will be connected to outer connection of the final package. Final electrical testing will be done on the outer connection before shipping the product to customer. The probe pads that are connected to the final package for the customer use are called "pin out pads". The probe pads that are not connected to the final package but are instead solely for manufacturer use are called "internal pads".

In conventional packaging, the connection of the pin out pad to the final package may be done by bonding the typically gold wire to a lead-frame. In the chip scale package, the connection may be created by placing the bump connectors, such as solder balls or other conductive bumps, on the pin out pad.

The current technology of electrical testing on wafer uses a probe card that has all the probe pin planarized in a single plane to make contact to the probe pads that are in a single plane. This is called a single level testing method.

The limitation of the current electrical testing technology does not allow probing on the "internal pads" and bumps simultaneously. This results in the use of two pass testing. A first pass testing is done on all the probe pads before the bumps are put on the chip. The first pass testing is also called pre-bump test. A second pass testing is done on the bump ball that is placed on the pin-out pads. The second pass testing is also called post-bump test. The primary purpose of the pre-bump test may be to identify an operational chips and/or further process the chips and the purpose of post-bump electrical testing on the packaged part may be to screen out defects in the bump packaging process.

In one example of further processing that may occur during the first pass processing, a variety of semiconductor devices (particularly precision analog semiconductor devices) requires that the circuits be trimmed after fabrication. Generally, trimming is the process of fine-tuning the performance of an integrated circuit device after fabrication in order to ensure conformance to a desired performance specification. In order to facilitate trimming, some of the internal pads are used as "trim pads" on the active surface of the die. Generally, a specific current is applied to each trim pad at a specific voltage in order to activate components (e.g. fuses) that can adjust the performance of the circuits of interest.

One example of using bump connectors is commonly referred to as "flip chip" packaging generally contemplates forming solder bumps (or other suitable contacts) directly on the face of an integrated circuit die. In some situations, the contacts are formed directly on I/O pads formed on the die, whereas in other situations the contacts are redistributed. The die is then typically attached to a substrate such as a printed circuit board or a package substrate such that the die contacts directly connect to corresponding contacts on the substrate.

When trim pads are included in flip chip package designs (or other wafer level chip scale packages) it is common to deposit a passivation material over the trim pads after the device has been trimmed. By way of example, a representative process might proceed as illustrated in FIG. 1. Specifically, after the wafer is fabricated (step 102), the wafer is taken to a wafer prober which tests and trims the appropriate circuits (step 104). The trim pads are generally formed from aluminum and thus they will corrode if left exposed in an ambient environment. Also, if they are left exposed when the singulated die is soldered to a substrate, there is a significant risk that the solder may bridge the gap between one of the bond pad/trim pad pairs, thereby shorting out the die. To avoid these problems, some manufacturing approaches contemplate covering the trim pads with a passivation material after the wafer has been trimmed. This helps reduce corrosion of the trim pads (step 106). Typically, the passivation layer also extends over edge portions of the I/O pads as well. Thus, the passivation layer is used to isolate the trim pads.

After the passivation layer is applied, appropriate under-bump metallization stacks are typically formed on the I/O pads (step 108) and the wafer is bumped (step 110). It should be appreciated that there may be a number of other processing steps that occur before, as part of, or after the bumping. When the desired processing is completed, the wafer is again taken to a wafer prober where the final testing occurs.

In this scenario, wafer probe testing must be done twice. Initially, the wafer must be probed to facilitate trimming, which must occur before the trim pads are insulated by the passivation material. The wafer must also be probed a second time to test for electrical function after the contact bumps have been placed on the dies. Although the described process works well, this two-part wafer probing process is inefficient, since the wafer must go to a testing facility for trimming, and subsequently, to a manufacturing facility to cover the trim pads and then back to the testing facility for the final wafer probing before the dies are cut and shipped to customers. These inefficiencies add to the overall cost of manufacturing these IC devices. Therefore, there are continuing efforts to reduce the costs and time associated with the manufacturing process.

Other wafers that have internal pads and bump connectors may also require at least two separate wafer probings.

SUMMARY

To achieve the foregoing and other objects of the invention, an apparatus for electrical testing of semiconductor devices is provided. A printed circuit board is provided. A first plurality of probe pins for probing bump connectors is electrically and mechanically connected to the printed circuit board. A second plurality of probe pins for probing probe pads are electrically and mechanically connected to the printed circuit board.

In another embodiment of the invention a method for testing a die on a wafer, wherein the die has a plurality of bumped connectors and probe pads is provided. A probe card is placed over the wafer, wherein the probe card comprises a printed circuit board, a first plurality of probe pins for probing bump connectors electrically and mechanically connected to the printed circuit board, and a second plurality of probe pins for probing probe pads electrically and mechanically connected to the printed circuit board, wherein the first plurality of probe pins contact the bump connectors and the second plurality of probe pins contact the probe pads simultaneously. Tests are run using the first plurality of probe pins and the second plurality of probe pins.

BRIEF DESCRIPTION OF THE DRAWINGS

The invention, together with further objects and advantages thereof, may best be understood by reference to the following description taken in conjunction with the accompanying drawings in which:

FIG. 1 is a process flow diagram illustrating an earlier method of packaging, trimming and testing a wafer.

FIG. 4 is a process flow diagram illustrating a method of packaging, trimming and testing a wafer using an embodiment of the invention.

It is to be understood that, in the drawings, like reference numerals designate like structural elements. Also, it is understood that the depictions in the figures are diagrammatic in nature and not to scale.

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 2:
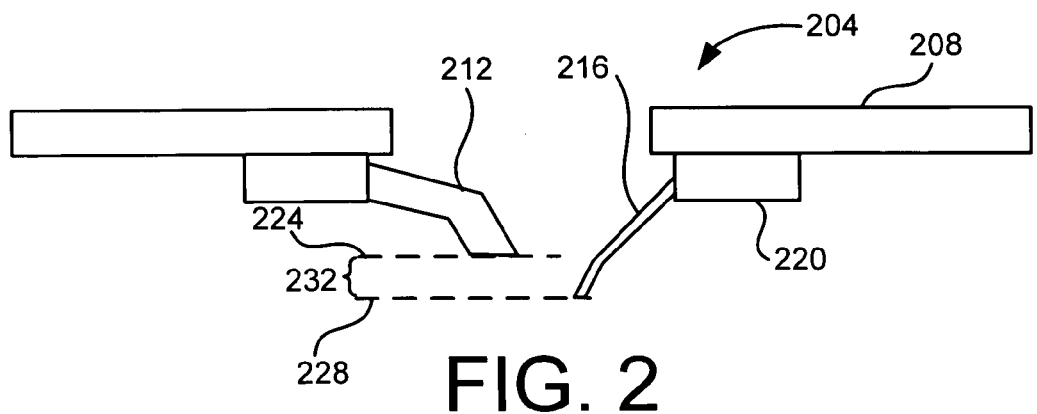
FIG. 2 is a schematic cross-sectional view of a wafer probe card according to an embodiment of the invention.

FIG. 2 is a schematic cross-sectional view of a wafer probe card 204 according to an embodiment of the invention. The wafer probe card 204 comprises a supporting circuit board 208, which may be a printed circuit board, a first probe 212 of a first plurality of probes, a second probe 216 of a second plurality of probes, and an epoxy support 220, which mechanically connects the probes to the circuit board 208 and provides support for positioning the probes. The first plurality of probes have tips that are along a first plane 224. The second plurality of probes have tips that are along a second plane 228 spaced apart from the first plane 224 by a distance 232.

Figure 3:
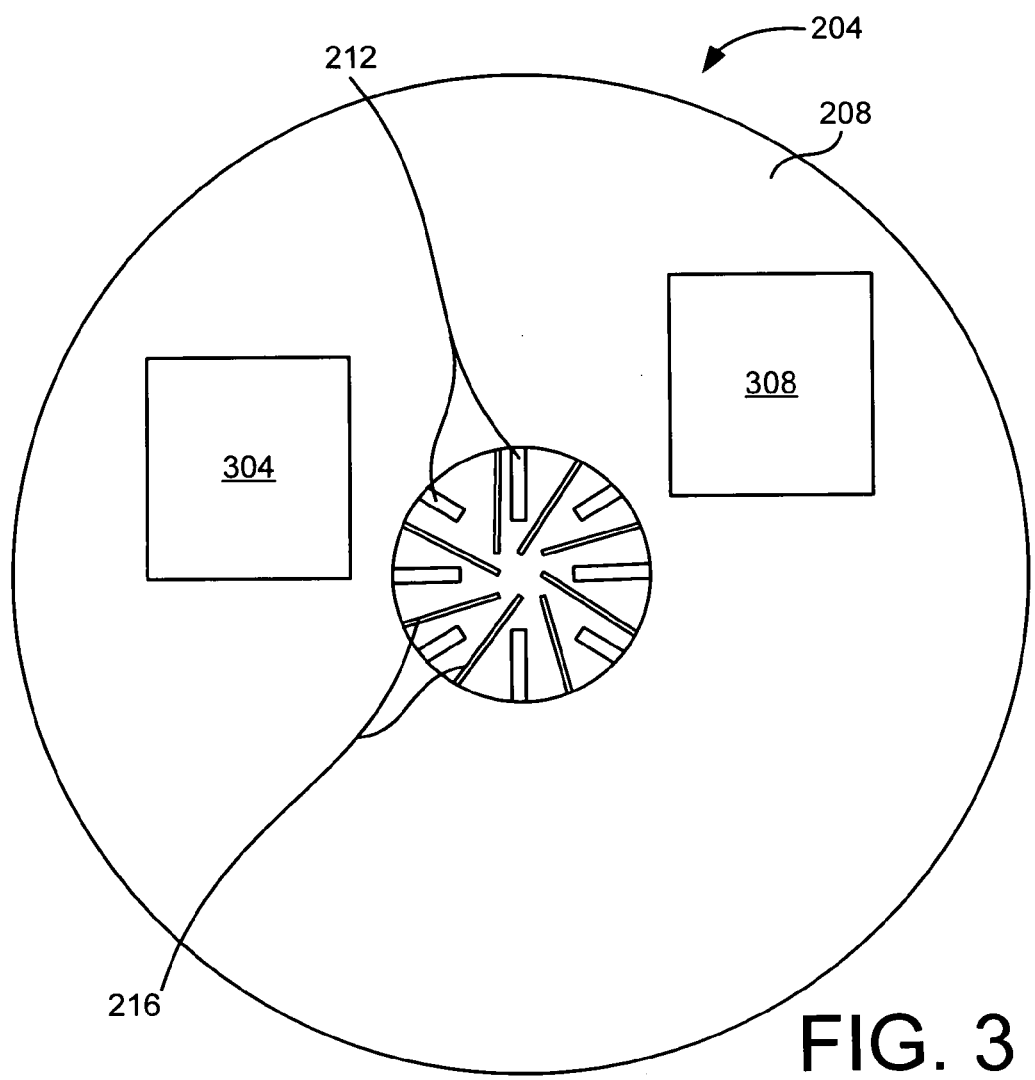
FIG. 3 is a schematic top view of the wafer probe card.

FIG. 3 is a schematic top view of the wafer probe card 204, comprising the circuit board 208, the first plurality of probes 212 and the second plurality of probes 216. A first circuit 304 and a second circuit 308 are schematically illustrated on the circuit board 208.

In an example of one use of the inventive wafer probe, a wafer is bumped prior to trimming. The bumped wafer may then be trimmed and finally tested at substantially the same stage of wafer processing. The dice on the wafer are trimmed and tested in one probing process. After the trimming and testing, an electrically insulative layer may be applied to the active surface of the wafer to cover the trim pads.

Figure 5D:
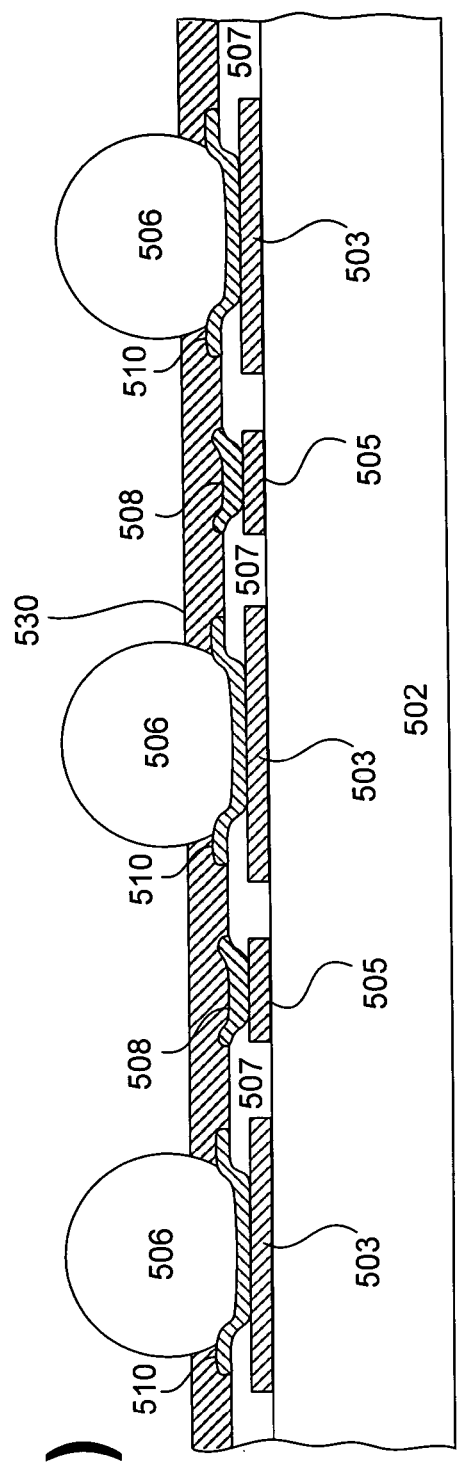
FIG. 5(a–d) are schematic cross-sectional views of a portion of a wafer at various stages of the process shown in FIG. 4.

Referring initially to FIG. 4 in conjunction with FIG. 5(a), a method of fabricating a wafer using one embodiment of the invention will be described. Initially, a wafer 500 is fabricated using conventional and/or appropriate wafer fabrication techniques (step 400). As will be appreciated by those skilled in the art, there is a wide variety of suitable wafer fabrication techniques. In this example the pin out pads are I/O pads and the internal pads are trim pads. The wafer generally will include a multiplicity of dice 502, which each include a number of I/O pads 503 and trim pads 505. FIG. 5(a) diagrammatically illustrates what a cross section of a suitable wafer might look like. Of particular note, a passivation layer 507 generally covers the top surface of the wafer. However, the passivation layer 507 has openings that expose the I/O pads 503 and trim pads 505.

When solder bumps are to be formed directly on the die, it is often desirable to form underbump metallization (UBM) stacks 510 over the I/O pads 503 to provide a good/non-corrosive adhesion base for the solder bumps, as shown in FIG. 5(b) (Step 402). In the illustrated embodiment, corresponding metallization stacks 508 are also formed over the trim pads 505. When the trim pads 505 are formed from a material (e.g. aluminum) that oxidizes when exposed to air, it can be particularly advantageous to metalize the trim pads 505 in addition to the I/O pads 503. After the underbump metallization stacks 510 have been formed, the wafer may be bumped by any of a wide variety of bumping processes (step 404). Typically, bumping involves forming solder balls on the underbump metallization stacks, however other suitable contact bump formation techniques (including non-solder based bump formation) can be used as well.

Figure 6A:
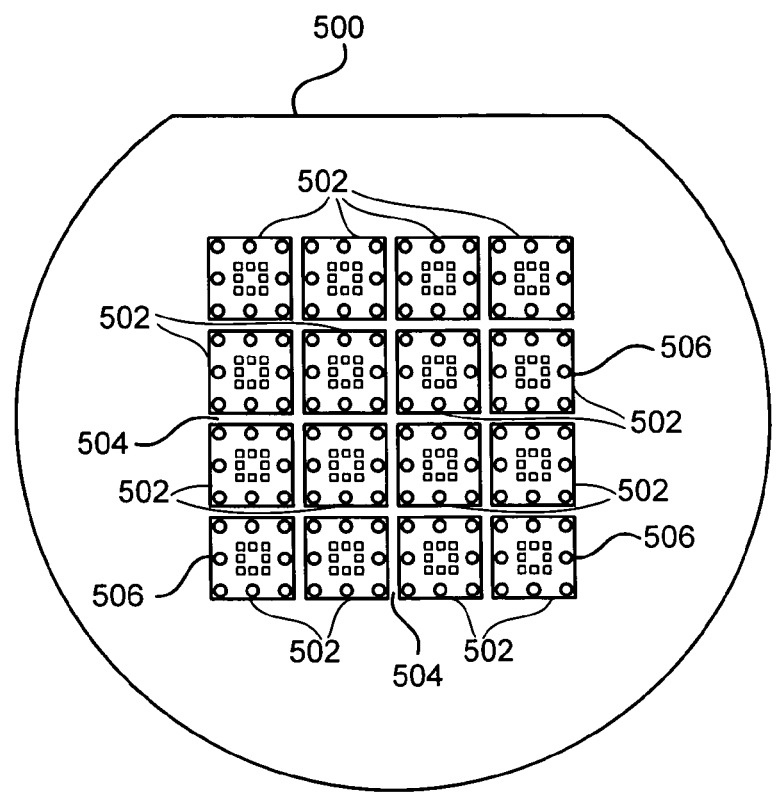
FIG. 6(a) illustrates in top plan view an exemplary wafer that may be tested with an embodiment of the invention.
Figure 6B:
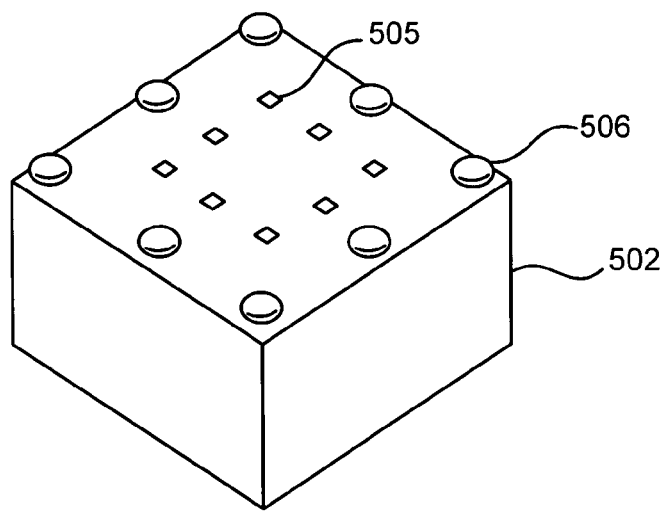
FIG. 6(b) illustrates in top perspective view a surface mount semiconductor die scribed from the wafer of FIG. 6(a).

A representative resulting bumped wafer 500 is illustrated in FIG. 6(a). As seen therein, the representative wafer 500 includes a plurality of dice 502. Each of the dice 502 includes a plurality of solder balls, contacts or "bumps" (bump connectors) 506 that are intended to be mounted directly onto contact pads of a substrate, such as a printed circuit board (PCB). The bumps 506 may be formed on the metallization stacks 510 as described above, directly on I/O pads on the die or redistributed using conventional redistribution techniques. (In the case of redistribution, if desired, the trim pads could also be redistributed). It should be noted that while only a relatively small number of dice 502 are shown on the wafer 500 for purposes of illustration, most wafers have significantly more dice formed thereon. By way of example, current state of the art wafers typically have several hundred to several thousand dice formed thereon, and some have more than ten thousand dice. As is well known in the art, most wafers and dice are formed of silicon, although any other appropriate semiconductor material can also be used, including, for example, gallium arsenide (GaAs), indium gallium phosphide, silicon germanium, and the like.

After the wafer has been bumped, other desired wafer level processing such as applying an opaque backcoating to the back surface of the wafer, wafer thinning, marking the wafer, etc. may be performed as desired (step 406). After the other desired wafer processing (if any) is performed, the wafer is trimmed and final tested (step 410). The trimming and final testing are performed simultaneously (i.e., using the inventive single pass of the wafer prober).

FIG. 5(c) is a schematic illustration of how the first plurality of probes 212 are in contact with the bump connectors 506 and the second plurality of probes 216 are in contact with the probe pads 505.

Figure 7:
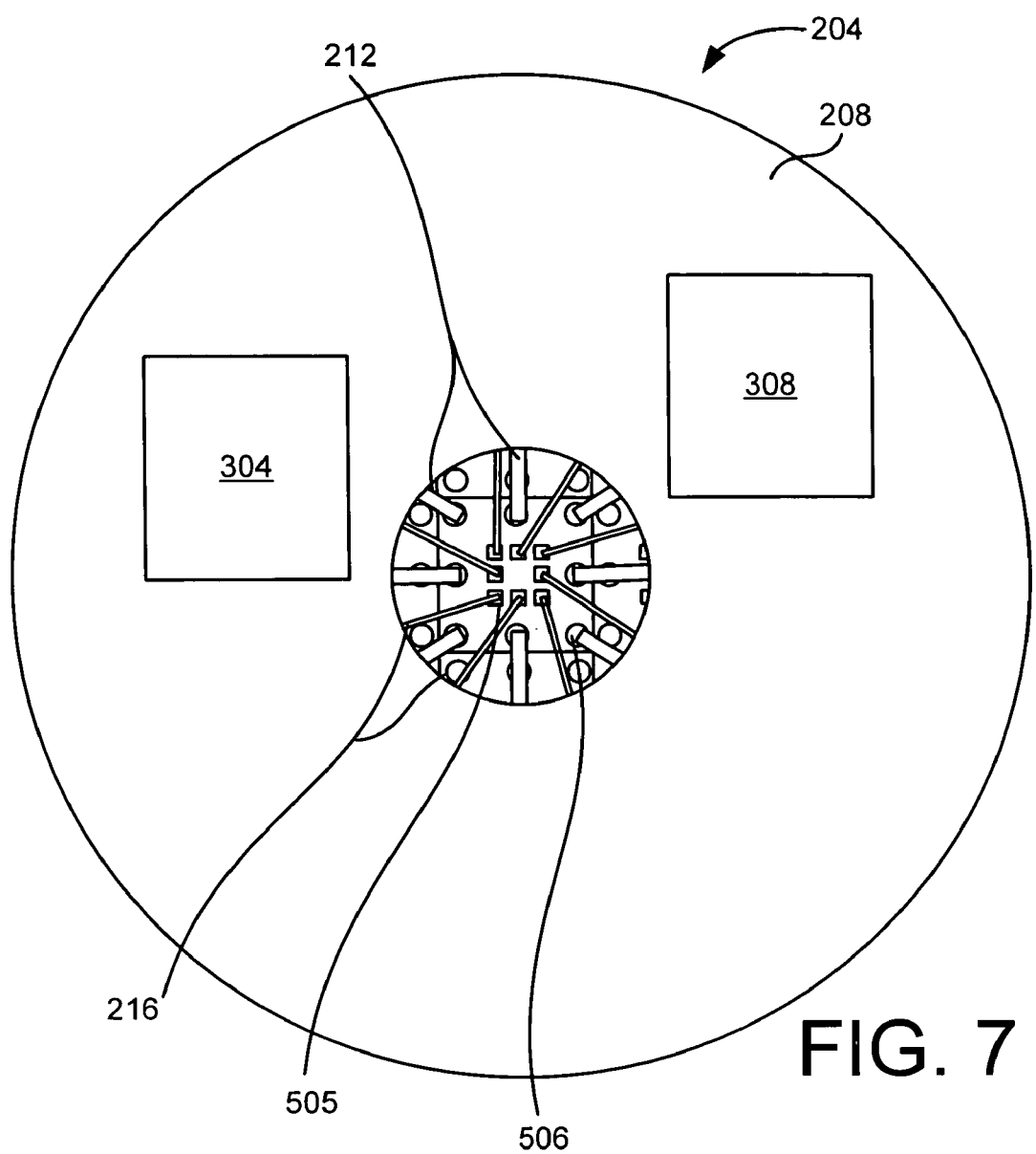
FIG. 7 is a top view of the wafer probe card positioned to test a die on a wafer.

FIG. 7 is a top view of the wafer probe card 204 positioned to test a die 520 on a wafer. As shown, the first plurality of probes 212 has contact with the bump connectors 506 and the second plurality of probes 216 are in contact with the probe pads 505. In this probe card 204, the first circuit 304 provides circuitry to allow the trimming process to take place. The second circuit 308 provides circuitry to allow the testing of the bump connectors. This allows the trimming of the resistors and testing the bump connectors using a single probe card in one testing.

A trim circuit may involve either charged capacitive current source or direct pulsed current source from an ATE (automatic test equipment). A newer test method mostly applies a direct pulse from ATE. There are also circuits to pulse a trim target simulation, which usually are banks of relays either on the probe card or by using relays on the ATE.

After the testing, an insulative layer 530 may be applied to the active surface of the wafer (412). The structure of a representative wafer 500 having an insulative layer 530 formed thereon is diagrammatically illustrated in FIG. 5(d).

The insulative layer 530 electrically insulates the trim pads and isolates the trim pads from the surrounding environment (thereby lowering the risk of corrosion). Since the application of the insulative layer occurs after the testing/trimming, the application of the insulative layer is not expected, intended or likely to affect the electrical characteristics of the integrated circuits in any significant manner, there is generally no need to retest the dice at the wafer level after the insulative layer has been applied.

After the insulative layer has been applied to the active surface of a wafer, then any additional wafer level processing that is desired may be performed, although it is generally preferable that only processes that are not expected to significantly impact the electrical characteristics of the integrated circuits be done after the wafer has been tested and trimmed. After any additional wafer level processing, the wafer may be singulated (step 414) using conventional wafer dicing techniques and the resulting dice may be handled as appropriate.

In other examples, the probe pads may be used for programming an EPROM/EEPROM or as test pads. If the probe pads are used for programming an EPROM (Electrical Programmable Read Only Memory), one of the circuits would be circuitry for programming EPROM's. As test pads, the probe pads may be used to for special tests such as thermal shutdown thresholds. The invention allows AC voltage, DC voltage and current to be used to channel to and from the probe pins to perform measurement of the performance of the chips simultaneously.

Although the prober is shown to test one die at a time, other embodiments may test multiple dice at one time.

In the manufacturing of the prober, a printed circuit board with the first and second circuit is provided. The first plurality and second plurality of pins are mechanically and electrically connected to the printed circuit board. Epoxy is used to position the pins in a desired configuration to define the two planes of pins. Further bending may be used to place the pins in the desired configuration. In a preferred embodiment, tip diameters of the first plurality of pins are about 0.004 inches and 0.006 inches. More preferably, the tip diameters of the first plurality of pins are about 0.006 inches. The tip diameters of the second plurality of pins are between 0.0005 to 0.001 inches. More preferably, the tip diameters of the second plurality of pins are about 0.001 inches. This is because thicker pins are desired for contacting the bumps to prevent puncturing the bumps and thinner pins are desired for the probe pads due to the probe pad size.

Preferably, the distance between the first plane and the second plane is between half the height of the bump connectors and the height of the bump connectors. More preferably, the distance between the first plane and the second plane is between three fourths the height of the bump connectors and the height of the bump connectors. Preferably, the distance between the first plane and second plane is between 0.001 inch and 0.015 inch (0.0025 mm and 0.0375 mm). More preferably, the distance between the first plane and the second plane is between 0.009 inch and 0.015 inch (0.0225 mm and 0.0375 mm).

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. An apparatus for electrical testing of semiconductor devices, comprising:
    a printed circuit board;
    a first plurality of probe pins for probing bump connectors electrically and mechanically connected to the printed circuit board, wherein said first plurality of probe pins are connected to circuitry for trimming said printed circuit board; and
    a second plurality of probe pins for probing probe pads electrically and mechanically connected to the printed circuit board, wherein said second plurality of probe pins are connected to circuitry for testing said printed circuit board, wherein each probe pin of the first plurality of probe pins has a tip, wherein each tip of the first plurality of probe pins is arranged to lie on a first plane and wherein each probe pin of the second plurality of probe pins has a tip, wherein each tip of the second plurality of probe pins is arranged to lie on a second plane different from the first plane.

2. The apparatus, as recite in claim 1, wherein the semiconductor devices have probe pads and bump connectors, wherein the bump connectors have a height, wherein the first plane and second plane are displaced by a distance between half the height of the bump connectors and the height of the bump connectors.

3. The apparatus, as cited in claim 2, wherein the first plurality of pins have tip diameters and the second plurality of pins have tip diameters, wherein the tip diameters of the first plurality of pins is greater than the tip diameters of the second plurality of pins.

4. The apparatus, as recited in claim 3, wherein the tip diameters of the first plurality of pins are between 0.004 inch and 0.006 inch, and wherein the tip diameters of the second plurality of pins are between 0.0005 inch and 0.001 inch.

5. The apparatus, as recited in claim 3, wherein the first plurality of pins and the second plurality of pins are mechanically connected to the printed circuit board by epoxy.

6. The apparatus, as recited in claim 3, further comprising a first circuit on the printed circuit board for testing bump connectors electrically connected to the first plurality of probe pins and a second circuit on the printed circuit board for testing probe pads electrically connected to the second plurality of probe pins.

7. The apparatus, as recited in claim 1, wherein the first plurality of pins have tip diameters and the second plurality of pins have tip diameters, wherein the tip diameters of the first plurality of pins is greater than the tip diameters of the second plurality of pin.

8. The apparatus, as recited in claim 7, wherein the tip diameters of the first plurality of pins are between 0.004 inch and 0.006 inch, and wherein the tip diameters of the second plurality of pins are between 0.0005 inch and 0.001 inch.

9. The apparatus, as recited in claim 1, wherein the first plurality of pins and the second plurality of pins axe mechanically connected to the printed circuit board by epoxy.

10. The apparatus, as recited in claim 1, further comprising a first circuit on the printed circuit board for testing bump connectors electrically connected to the first plurality of probe pins and a second circuit on the printed circuit board for testing probe pads electrically connected to the second plurality of probe pins.

11. A method for testing a die on a wafer, wherein the die has a plurality of bumped connectors and probe pads, comprising:
    placing a probe card over the wafer, wherein the probe card comprises a printed circuit board, a first plurality of probe pins for probing bump connectors electrically and mechanically connected to the printed circuit board, and a second plurality of probe pins for probing probe pads electrically and mechanically connected to the printed circuit board, wherein the first plurality of probe pins contact the bump connectors and the second plurality of probe pins contact the probe pads simultaneously; and
    running tests using the first plurality of probe pins and the second plurality of probe pins; and
    trimming said printed circuit board using the first plurality of probe pins during a same pass as said running of said tests, wherein each probe pin of the first plurality of probe pins has a tip, wherein each tip of the first plurality of probe pins is arranged to lie on a first plane and wherein each probe pin of the second plurality of probe pins has a tip, wherein each tip of the second plurality of probe pins is arranged to lie on a second plane different from the first plane.

12. The method, as recited in claim 11, wherein the running tests uses AC voltage, DC voltage, and current to and from the probe pins to perform measurements on the die.

13. The method, as recite in claim 12, wherein the semiconductor devices have probe pads and bump connectors, wherein the bump connectors have a height, wherein the first plane and second plane are displaced by a distance between half the height of the bump connectors and the height of the bump connectors.

14. The method, as recited in claim 11, wherein the first plurality of pins have tip diameters and the second plurality of pins have tip diameters, wherein the tip diameters of the first plurality of pins is greater than the tip diameters of the second plurality of pins.

15. The method, as recited in claim 14, wherein the tip diameters of the first plurality of pins are between 0.004 inch and 0.006 inch, and wherein the tip diameters of the second plurality of pins are between 0.0005 inch and 0.001 inch.

16. The method, as recited in claim 14, wherein the first plurality of pins and the second plurality of pins are mechanically connected to the printed circuit board by epoxy.

17. The method, as recited in claim 14, further comprising a first circuit on the printed circuit board for testing bump connectors electrically connected to the first plurality of probe pins and a second circuit on the printed circuit board for testing probe pads electrically connected to the second plurality of probe pins.

* * * * *

UNITED STATES PATENT AND TRADEMARK OFFICE
CERTIFICATE OF CORRECTION

| | | |
|---|---|---|
| PATENT NO. | : 7,102,371 B1 | Page 1 of 1 |
| APPLICATION NO. | : 10/850229 | |
| DATED | : September 5, 2006 | |
| INVENTOR(S) | : Tang et al. | |

It is certified that error appears in the above-identified patent and that said Letters Patent is hereby corrected as shown below:

In line 5 of claim 7 (column 7, line 8) change "pin" to --pins--.

In line 2 of claim 9 (column 7, line 14) change "axe" to --are--.

Signed and Sealed this

Eighth Day of May, 2007

JON W. DUDAS
*Director of the United States Patent and Trademark Office*